(12) United States Patent
Lahti

(10) Patent No.: US 6,653,978 B2
(45) Date of Patent: *Nov. 25, 2003

(54) MINIATURIZED RADIO FREQUENCY ANTENNA

(75) Inventor: Saku Lahti, Tampere (FI)

(73) Assignee: Nokia Mobile Phones, Ltd., Espoo (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/553,265

(22) Filed: Apr. 20, 2000

(65) Prior Publication Data

US 2002/0000935 A1 Jan. 3, 2002

(51) Int. Cl.$^7$ ................................................. H01Q 1/24
(52) U.S. Cl. .............................. 343/702; 343/700 MS; 343/895
(58) Field of Search ................................ 343/895, 873, 343/702, 700 MS; H01Q 1/24

(56) References Cited

U.S. PATENT DOCUMENTS

| | | | | |
|---|---|---|---|---|
| 5,696,517 A | * | 12/1997 | Kawahata et al. ... | 343/700 MS |
| 5,764,198 A | * | 6/1998 | Tsuru et al. ................ | 343/895 |
| 5,818,398 A | | 10/1998 | Tsuru et al. ................ | 343/895 |
| 5,867,126 A | * | 2/1999 | Kawahata et al. .......... | 343/702 |
| 5,909,198 A | * | 6/1999 | Mandai et al. .............. | 343/895 |
| 5,926,139 A | * | 7/1999 | Korisch ...................... | 343/702 |
| 5,986,609 A | | 11/1999 | Spall ........................... | 343/702 |
| 5,999,146 A | * | 12/1999 | Kanba et al. ................ | 343/895 |
| 6,028,554 A | * | 2/2000 | Mandai et al. .............. | 343/895 |
| 6,054,956 A | * | 4/2000 | Mandai et al. .............. | 343/702 |
| 6,064,351 A | * | 5/2000 | Mandai et al. .............. | 343/873 |
| 6,326,919 B1 | | 12/2001 | Diximus et al. ............ | 343/700 |
| 6,353,443 B1 | | 3/2002 | Ying .......................... | 345/702 |

OTHER PUBLICATIONS

"Design of GPS Microstrip Antenna Using Nearly Square Patch", C. Huang et al, *1997 Asia Pacific Microwave Conf.*, pp. 237–240.

J. Kraus, "Antennas", McGraw–Hill 1988, pp. 332–333.

* cited by examiner

Primary Examiner—Hoanganh Le
(74) Attorney, Agent, or Firm—Ware, Fressola, Van Der Sluys & Adolphson LLP

(57) ABSTRACT

A device and method for receiving signals in the radio frequency range by a mobile phone. The device comprises a radiator part having a ¼ wave electric length (or an odd integral multiple thereof) for receiving the signals, wherein the feed of the radiator part is tapped for impedance matching. In order to reduce to the size of the device so that it can be implemented in a mobile phone or a communicator, the radiator part is placed at the proximity of a frame having a medium relative permittivity for dielectric loading. The relative permittivity of the frame ranges from 2 to 50 in the radio frequency range. Preferably, one or more devices are placed at one of the corners of the mobile phone body so that one device will be selected to receive the signals based on the interaction between the radiation modes of the device and the radiation field of the mobile phone body in order to achieve a right-handed, circular or elliptical polarization.

8 Claims, 11 Drawing Sheets

(WT Plane)

(HT Plane)

(HW Plane)

MINIATURIZED RADIO FREQUENCY ANTENNA

FIELD OF THE INVENTION

The present invention relates generally to an antenna for transmitting and receiving electromagnetic waves carrying messages in the radio frequencies and, in particular, to Global Positioning System (GPS) antennas operating in the 1575.42 MHz frequency band.

BACKGROUND OF THE INVENTION

A CDMA telephony system is based on spread-spectrum technology and is one of the most widely used digital wireless services today. The spread-spectrum signal requires sophisticated broadcast power management and soft handovers between base stations. This means that the base stations must be precisely timed. With the CDMA wireless telephony system, each transmitter must maintain its frequency to within one part in ten billions. It is advantageous and desirable to have an antenna in a mobile phone so as to allow the mobile phone to receive messages in the CDMA as well as WCDMA system. Furthermore, the U.S. Federal Communications Commission has introduced regulations requiring wireless service providers to supply the location of all system users for emergency situations. In particular, the Wireless Communications and Public Safety Act, also known as E-911, makes 911 the universal emergency number for wireless telephones so that the cellular user who has been in an accident can be automatically located. Thus, it is advantageous and desirable to provide a positioning antenna in a mobile phone.

Currently, GPS technology enables accurate timing and synchronization between base stations so that cellular calls can be flawlessly passed from one base station to another. The GPS satellites transmit two microwave carrier signals: the L1 frequency (1575.42 MHz) which carries the navigation message and the Standard Positioning Services (SPS) code signals; and the L2 frequency (1227.60 MHz) which is used for ionospheric delay measurement carried out by the Precise Positioning Services (PPS) equipped receivers. Three binary codes are used to shift the L1 and/or L2 carrier phases: 1) the Coarse Acquisition (C/A) Code, which is a repeating 1.023 MHz Pseudo Random Noise (PRN), code-modulates the L1 carrier phase, spreading the spectrum over a 2.046 MHz bandwidth, or a larger bandwidth such as 10 MHz. For the code-phase modulation, each GPS satellite is assigned a different C/A code PRN, so that each GPS satellite can be identified by a unique PRN code; 2) the Precise (P) Code uses a 10.23 MHz PRN code for modulating both the L1 and L2 carrier phases for the military receivers; and 3) the navigation message, which is used to modulate the L1-C/A or P(Y) code signal, is a 50 Hz signal consisting of data bits that describe the GPS satellite orbits, system time, position, clock corrections, and other system parameters.

As described above, GPS provides both the Standard Positioning Service (SPS) and the Precise Positioning Service (PPS). Only the SPS is designated for the civil community. Thus, in order to receive signals broadcast from the GPS satellites, the antenna should be tuned to the L1 band with a suitable bandwidth. The GPS antenna is required to be right-handed circularly polarized (RHCP) or right-handed elliptically polarized (RHEP) and to provide near hemispherical coverage in order to achieve optimum performance.

In a mobile phone, a communicator device or other small hand-held electronic device, it is preferable for the GPS antenna to be small in size and rugged. Preferably, the antenna can be mass-produced without individual tuning in order to reduce cost. Currently, a number of small size antennas are used in small electronic devices. U.S. Pat. No. 5,986,609 (Spall) discloses an antenna configured to be enclosed within the flip cover of a radiotelephone and to resonate in three frequency bands including a GPS L1 band. The disclosed antenna is a half-wave dipole antenna which includes two tapered radiating elements located on opposite sides of a substrate. Although the disclosed antenna is intended to be used in a radiotelephone, its implementation is restricted in that the antenna cannot be placed differently to improve the radiation efficiency. Furthermore, the size of the antenna is not small enough to be implemented within the phone body. In an article entitled "Design of GPS Microstrip Antenna using Nearly Square Patch" (1997 Asia Pacific Microwave Conference), Chih-Yu Huang et al. discloses a ceramic patch design. Ceramic patches are known to be compact. However, small ceramic patch antennas are extremely narrow-banded and need to be individually tuned. In the monograph entitled "Antennas" (McGraw-Hill 1988), Kraus discusses a quadrifilar helix in which each of the four (½)λ wires forms a half-turn of a helix on a cylindrical frame. However, the quadrifilar helical antennas as disclosed are unpractically large for mobile phones and small-sized, hand-held devices.

SUMMARY OF THE INVENTION

It is, therefore, an object of the present invention to provide a miniature circularly or elliptically polarized antenna having sufficient gain which can be mounted on or enclosed within a mobile phone or other miniature hand-held electronic device. In particular, the antenna is designed to resonate over the GPS frequency bands or other radio frequency bands with improved radiation efficiency over the existing miniature antennas.

It is another object of the present invention to provide a method of installing miniature antennas in a mobile phone or other hand-held electronic device in order to achieve an improved axial ratio.

According to one aspect of the present invention, the radio frequency antenna comprises a radiating element implemented on a supporting frame. In order to match the impedance of the radiating element, the feed of the radiating element is tapped. Thus, one end of the radiating element is short-circuited to a ground plane and the feed point of the antenna is located at the close proximity of the grounding point. Preferably, the radiating element is substantially equal to a quarter-wave electric length or an odd integral multiple thereof. It is also preferred that the supporting frame be made of a material having a medium relative permittivity so as to effect dielectric loading to the antenna in order to reduce the size thereof. The relative permittivity of the support frame material can range from 2 to 50 in the radio frequency range. Preferably, the relative permittivity of the supporting frame material ranges from 2 to 50 in the GPS frequency range. With this dielectric loading technique, the size of the antenna can be substantially reduced.

According to the preferred embodiment of the radiating antenna, the radiating element has a helical shape spiraling around the supporting frame.

According to another embodiment of the antenna, the radiating element is shaped like a single meander line on a surface of the supporting frame.

The method of receiving signals in the radio frequency range by a mobile phone, according to another aspect of the present invention, comprises the steps of:

providing a radiator part having substantially a quarter-wave electric length to receive electromagnetic waves containing the signals; and providing means for effecting dielectric loading on the radiator part in order to reduce the size thereof.

In particular, the radiator part includes a signal conduit part joining the radiator part at a feed point in order to retrieve the signals from the radiator part; and an impedance matching part joining the radiator part at the proximity of the feed point in order to match the impedance of the radiator part.

A further aspect of the present invention is a method of achieving a right-handed circularly or elliptically polarized antenna in a mobile phone, wherein the mobile phone has a phone body having four corners to define a plane having a long axis and a short axis. The method comprises the steps of: providing at one of the phone body corners a radiator part having substantially a quarter-wave electric length to generate a radiating mode along the long axis and another radiating mode along the short axis; providing a support frame located at the proximity of the radiator part to effect dielectric loading on the radiator part in order to reduce the size thereof. Furthermore, the radiator part includes a resonating region and a feeding region, wherein the feeding region has a signal conduit part joining the resonating region at a feed point in order to retrieve signals from the resonating region; and an impedance matching part joining the resonating region at the proximity of the feed point.

It should be noted that the radiator part as described above is divided into a resonating region and a feeding region only in a loose sense. The feeding region, to some extent, also affects the resonating properties of the antenna as it also affects the radiating modes of the antenna.

Alternatively, two or more antennas can be implemented on different corners of the substrate so that one antenna can be selected by switching means to achieve improved circular or elliptical polarization.

A further aspect of the present invention is an electronic device having means for receiving signals in the radio frequency range, wherein the receiving means comprises: a radiator part having substantially a quarter-wave electric length implemented on a support frame having a medium relative permittivity for effecting dielectric loading on the radiator part; and means for matching the impedance of the radiator part.

The present invention will become apparent upon reading the description taken in conjunction with FIGS. 1–9c.

DETAILED DESCRIPTION OF THE INVENTION

Figure 1:
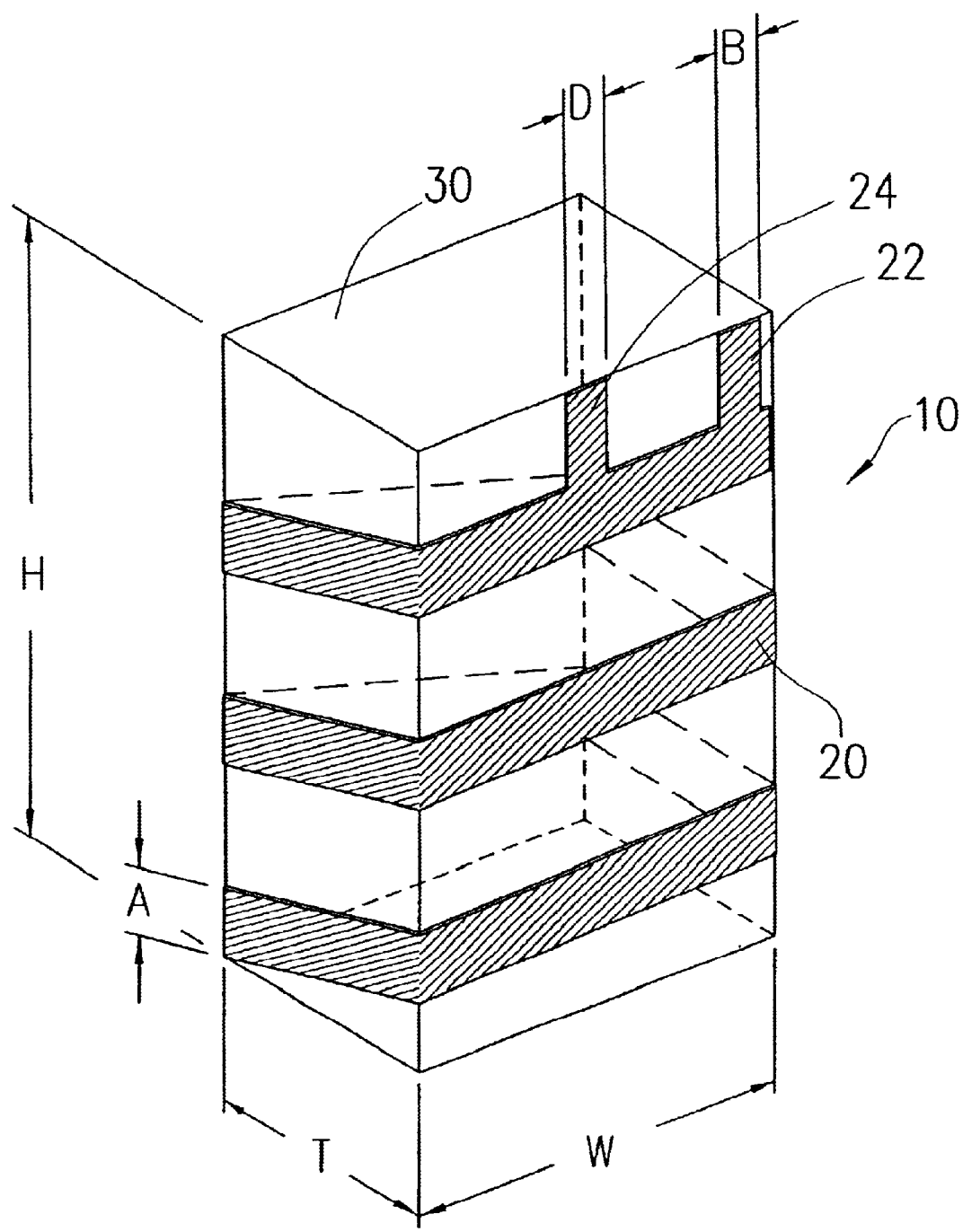
FIG. 1 is an isometric view showing a helical antenna, according to the preferred embodiment of the present invention.

As shown in FIG. 1, the radio frequency or GPS antenna 10 includes an electrically conducting radiating element 20 constructed around a supporting block 30. Preferably, the supporting block 30 is made of a material having a relative permittivity in the range of 2 to 50 so as to effect dielectric loading to the antenna. Dielectric loading is used so that the size of the antenna can be suitably reduced so that the antenna can be used in a mobile phone or other small hand held devices. The approximate dimensions of the supporting block 30 are denoted by H, W and T. In an exemplary GPS antenna, the support block 30 is made of a plastic having a relative permittivity of approximately 10 in the GPS frequency range, and the dimensions of the supporting block 30 are approximately H=9 mm, W=5 mm and T=3 mm. However, the dimensions can be larger or smaller. Preferably, the radiating element 20 has a helical shape spiraling around the supporting block 30. Preferably, the feed of the radiating element 20 is tapped for impedance matching. Accordingly, one end of the radiating element 20 is short-circuited to a ground (not shown) by a grounding pin 22, and a feeding pin 24 is connected to the radiating element 20 to provide a feed point at the close proximity of the grounding point. As such, the radiating element 20 constitutes the resonating region of the antenna while the grounding pin 22 and the feeding pin 24 constitute the feeding region of the antenna. The feeding pin 24 is used as a signal conduit to retrieve signals from the resonating region while the ground pin 22 is used as an impedance matching part for matching the impedance of the resonating region.

As shown, the radiating element 20 which is a helix having two and a half turns to make up a length of approximately 50 mm. Partly due to the shape of the radiating element 20 and partly due to the medium relative permittivity of the supporting frame 30, the size of the antenna 10 is sufficiently small to be installed in a mobile phone or other hand-held electronic device. In this exemplary antenna, the widths A, B, D of the radiating element 20, grounding pin 22 and feeding pin 24, respectively, are approximately equal to 1 mm, while the distance between the grounding pin 22 and the feeding pin 24 is approximately 3 to 5 mm. It is understood that the dimensions of the various parts of the antenna 30 can be changed according to the shape of the radiating element 20 and the relative permittivity of the supporting block 30.

Figure 2:
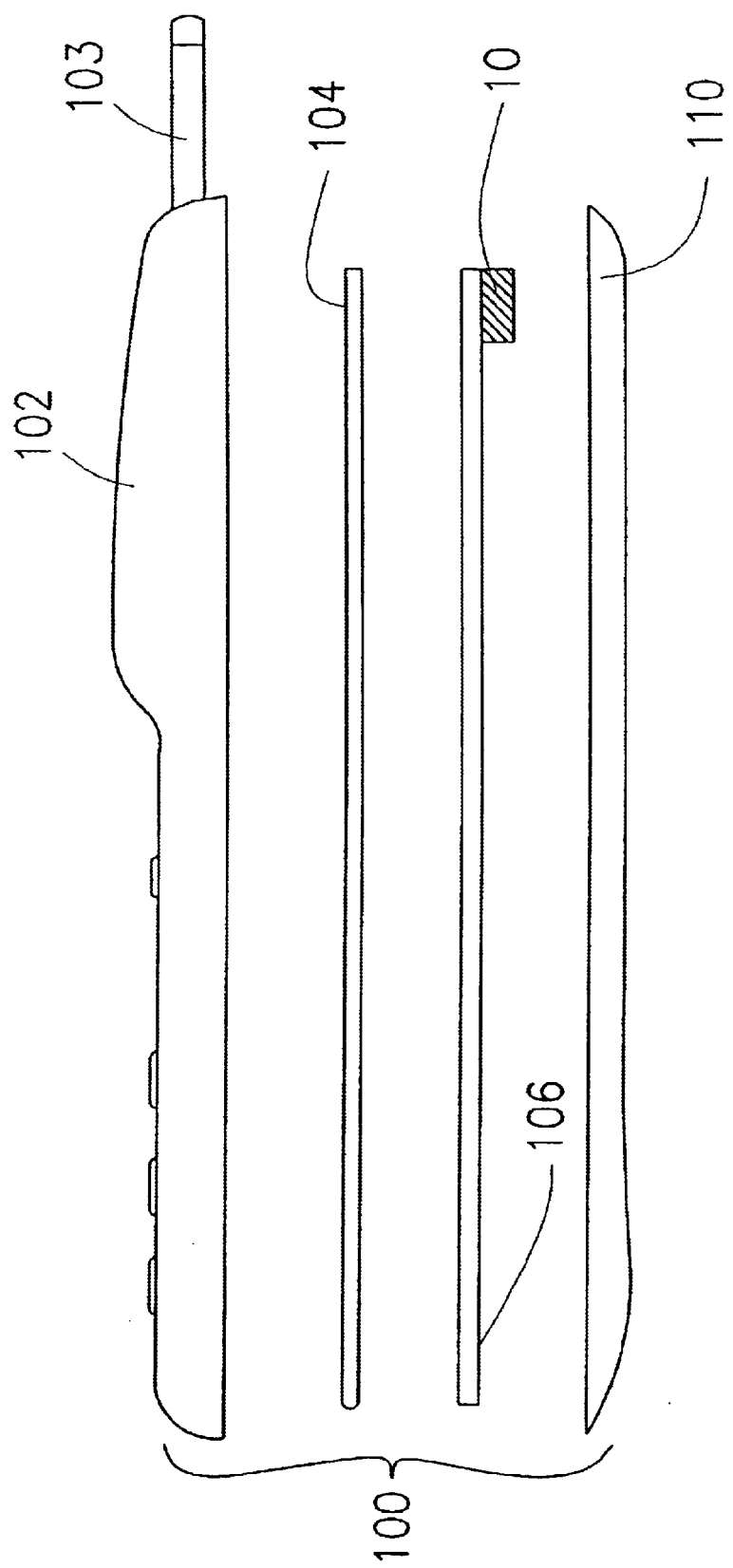
FIG. 2 is an exploding view showing the preferred location for implementing the radio frequency antenna in a mobile phone.

As shown in FIG. 2, reference numeral 100 denotes a mobile phone or a communicator having a front portion 102 including a mobile phone antenna 103, a chassis 104, a printed-circuit board (PCB) 106 and a back cover 110. It is preferred that the GPS antenna 10, according to the present invention, be mounted on the PCB 106.

Figure 3:
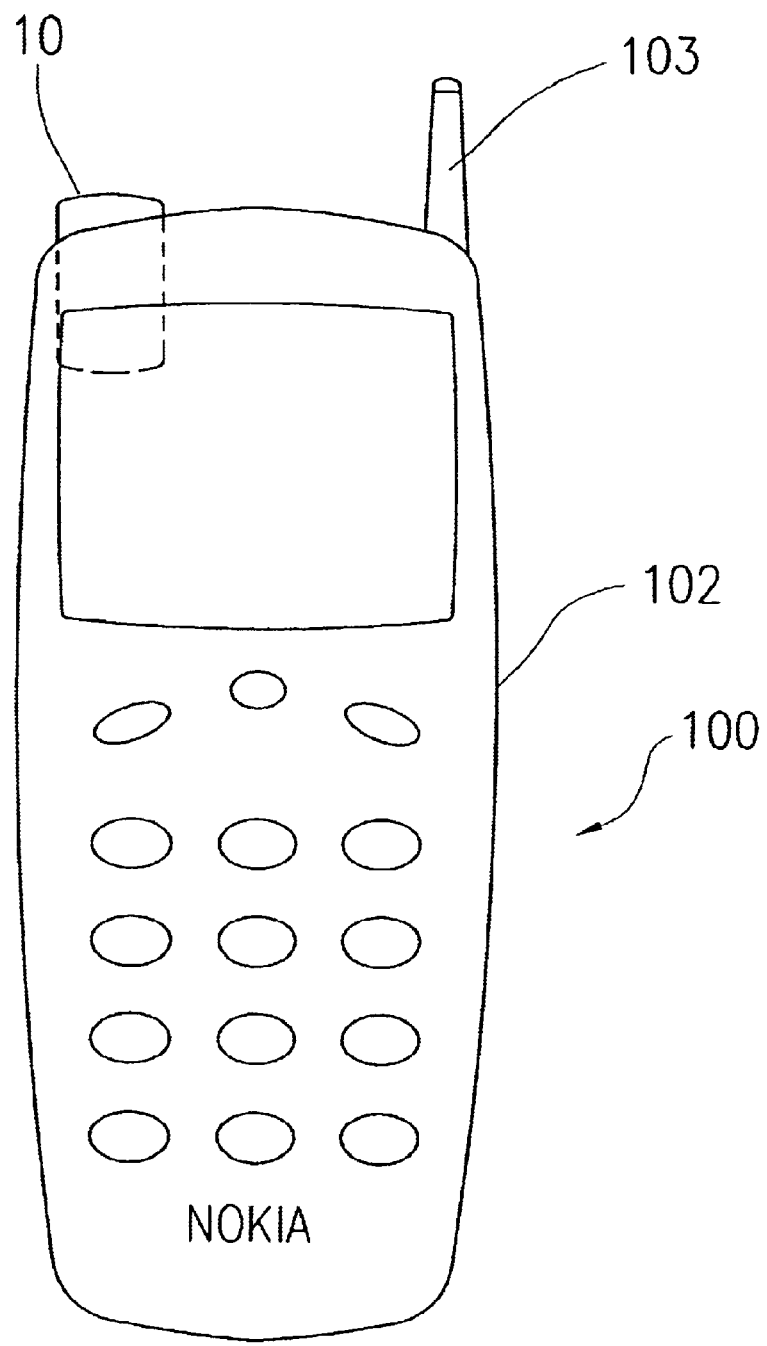
FIG. 3 is a perspective view showing a mobile phone having a mobile phone antenna and a radio frequency antenna.

When used in an electronic device, such as a mobile phone, which has by itself a certain radiating mode, the radio frequency antenna must be oriented and placed in such a way that the radiating mode in the antenna is orthogonal and in 90 degree phase shift compared to the radiating mode of the device body. With its reduced size, the radio frequency antenna according to the present invention has the advantage of being able to be implemented differently and at different parts of an electronic device. In particular, it is preferred that the radio frequency antenna be implemented on a corner of the device body with a sticking upward position, as shown in FIG. 3.

Figure 4C:
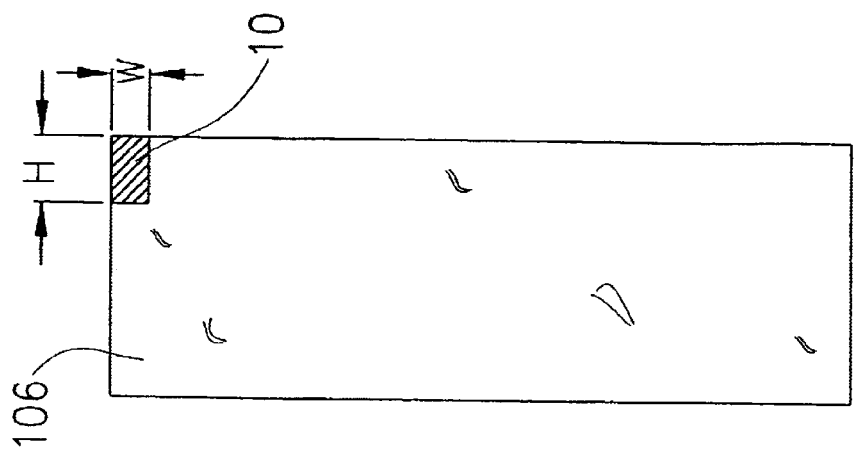
FIGS. 4a–4c are diagrammatic representations showing different implementations of the radio frequency antenna on a Printed-Circuit Board (PCB).
Figure 4B:
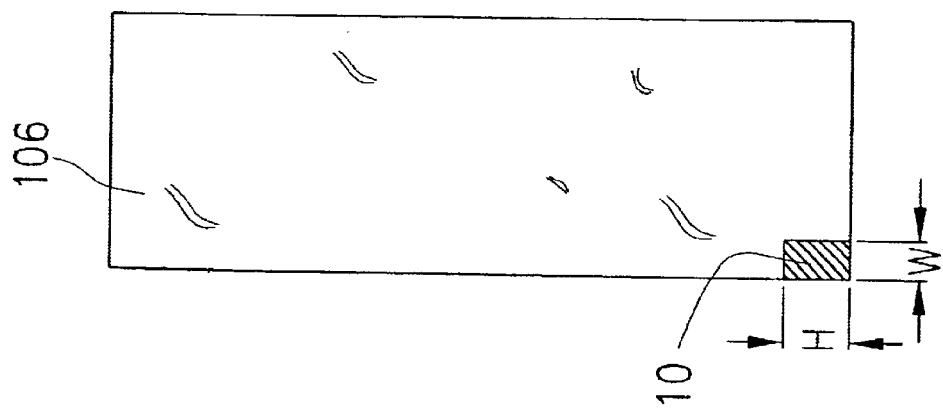
Figure 4A:
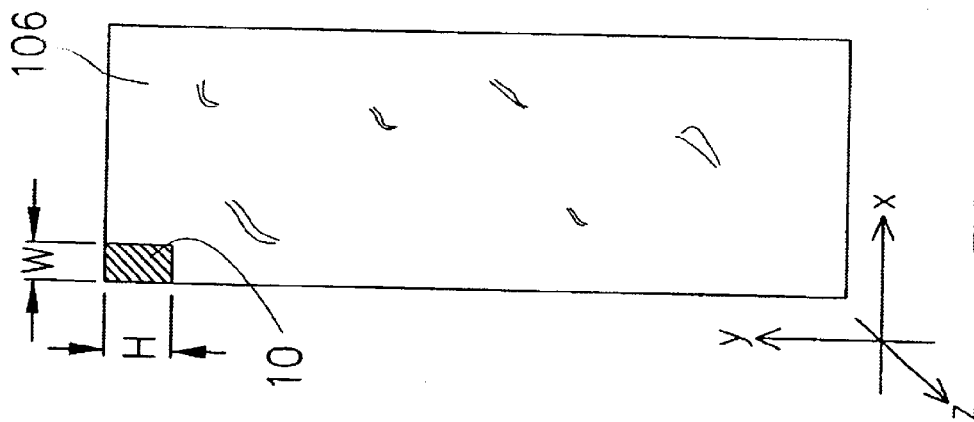

FIGS. 4a–4c are diagrammatic representations showing different implementations of the GPS or radio frequency antenna 10 on the PCB 106. Preferably, the GPS antenna 10 is mounted in one of the corners of the PCB 106. When the antenna 10 is placed in a corner of the PCB 106, two radiating modes are generated in the phone body: one along the Y axis and one along the X axis. Because the wave number of one mode is different from the wave number of the other mode, a phase shift exists between the radiation patterns of the two radiation modes. This phase shift is essential in generating the circular polarization. When the antenna 10 is placed in the upper right corner of the PCB 106 as shown in FIG. 4c or the lower left corner as shown in FIG. 4b, the radiation in the Z direction is right-handed circularly or elliptically polarized while the radiation in the −Z direction is left-handed circularly or elliptically polarized. When the antenna 10 is placed in the upper left corner of the PCB 106 as shown in FIG. 4b, the radiation in the Z direction is left-handed circularly or elliptically polarized while the radiation in the −Z direction is right-handed circularly elliptically polarized.

Figure 5:
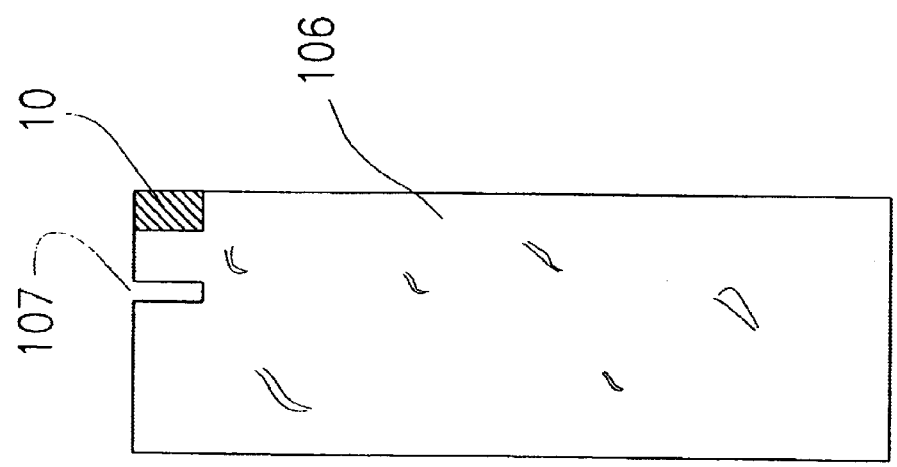
FIG. 5 is a diagrammatic representation showing a method of tuning the PCB for optimizing the polarization purity of the radio frequency antenna.

It is possible to tune the radiating mode of the phone body by cutting one or more slits 107 on the PCB 106 as shown in FIG. 5. By adjusting the size of the slit 107, the polarization purity of the GPS antenna 10 placed on a phone body can be optimized.

Figure 6:
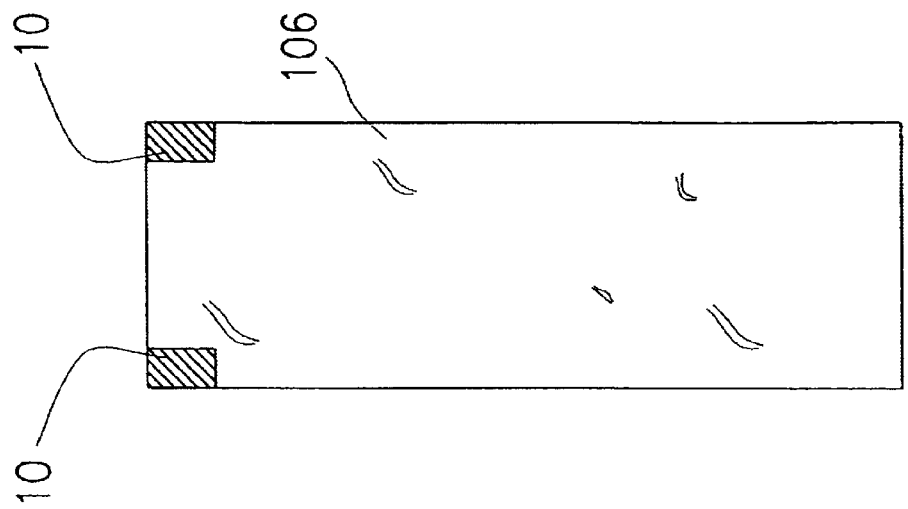
FIG. 6 is a diagrammatic representation showing a method of achieving an improved circular or elliptical polarization.
Figure 10:
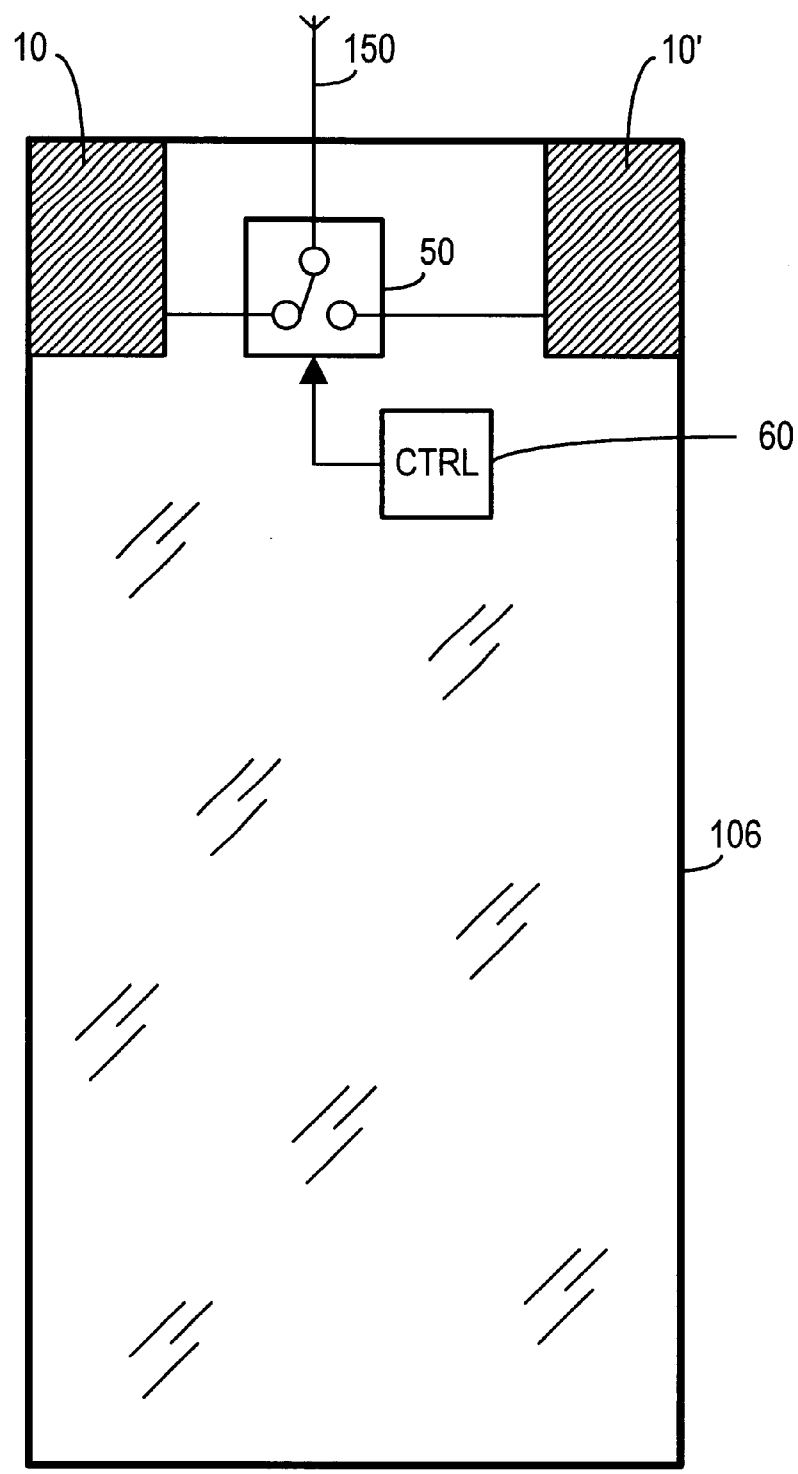
FIG. 10 is a diagrammatic representation showing the selection of GPS antennas on the same mobile phone.

It is also possible that two or more antennas 10, preferably identical, are placed in different corners of the PCB 106 so that one antenna 10 is selected to achieve optimum performance. Because the radiation of the device body where the antenna is implemented may vary depending on the design of the device, the one antenna that yields the best response can be selected for receiving the GPS signals by an electronically controlled device such as a pin diode, a Micro Electro-Mechanical Switch (MEMS). The selection of antennas is shown in FIG. 10. FIG. 6 shows two GPS antennas 10 are placed in the upper corners of the PCB 106.

Figure 7:
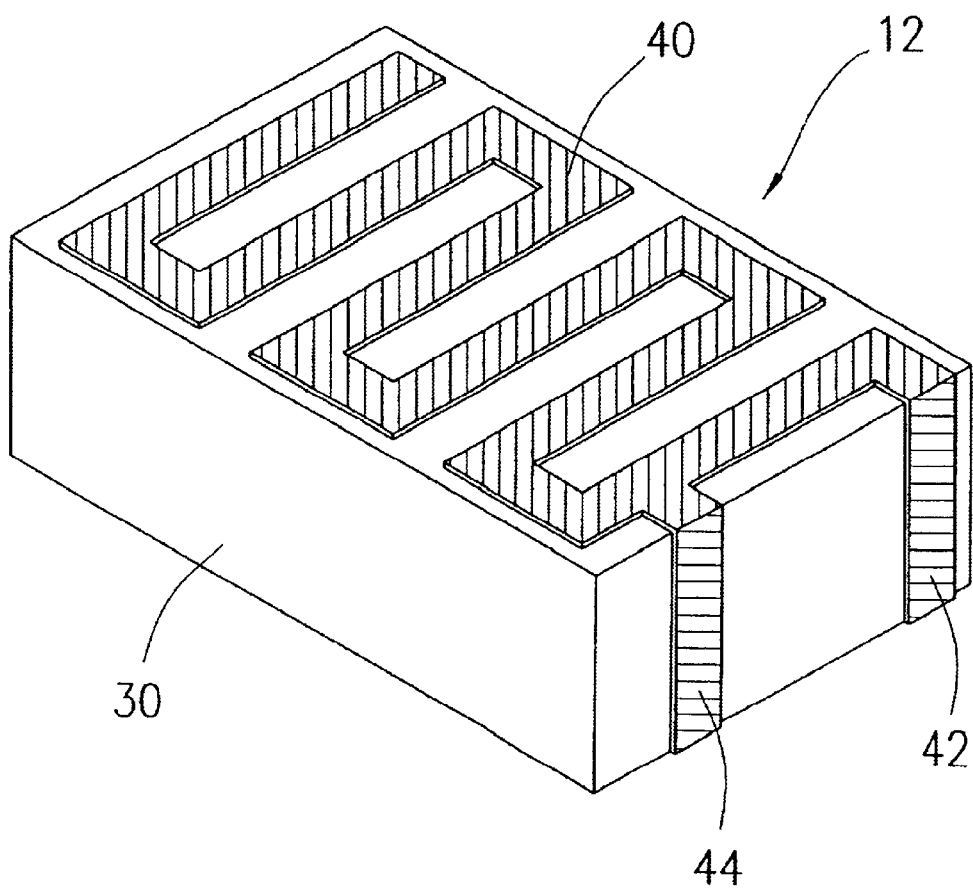
FIG. 7 is an isometric view showing another embodiment of the present invention.

FIG. 7 shows another embodiment of the radiating element of the GPS or radio frequency antenna. As shown, the radiating element 40 of the GPS antenna 12 is a meander line having a grounding pin 42 and a feeding pin 44. The meander line can be implemented on one or more surfaces of the supporting block 30.

Figure 8:
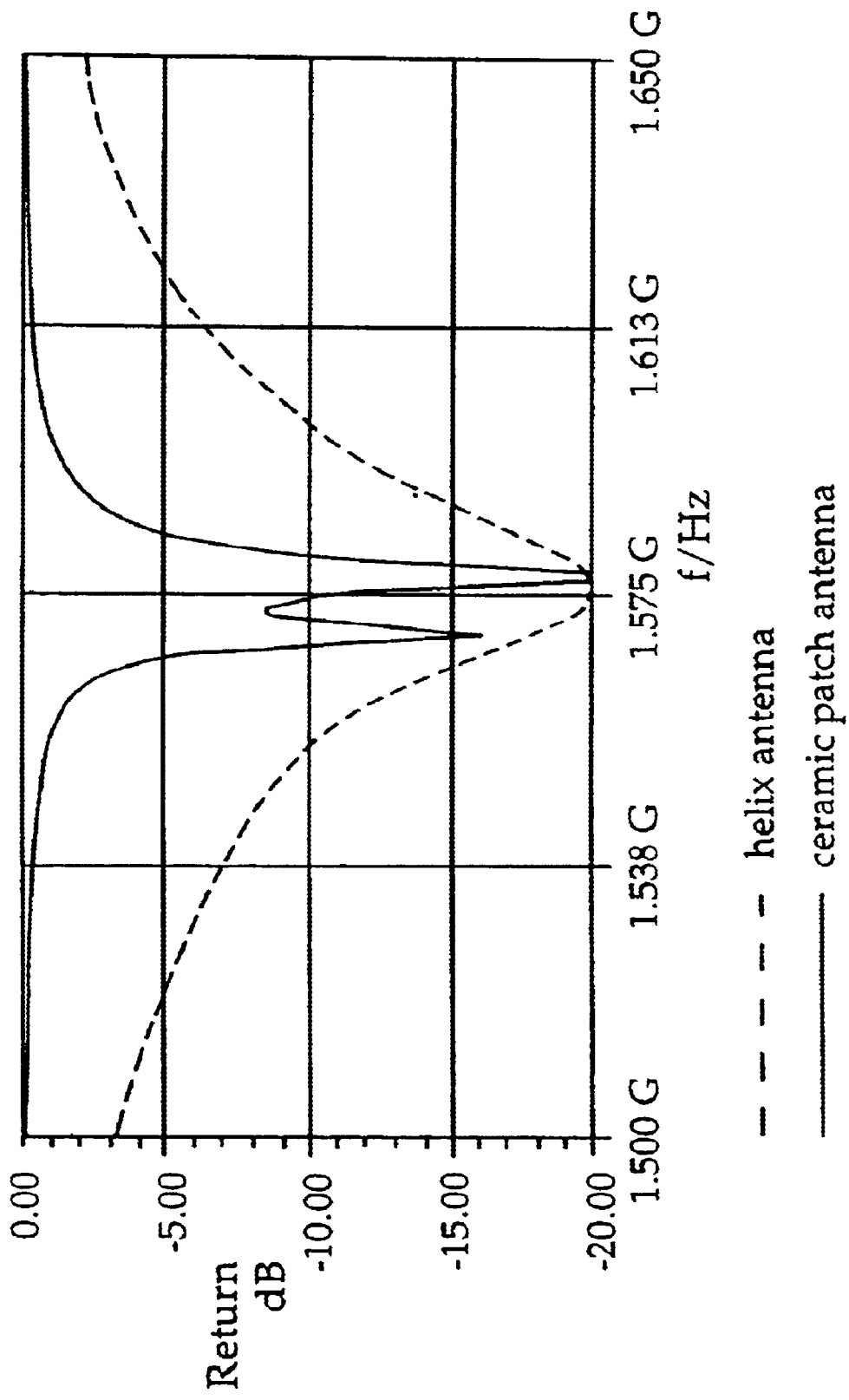
FIG. 8 is a plot showing the bandwidth of a helical antenna in comparison with the bandwidth of a ceramic patch antenna.

The miniature antenna of the present invention has a broader bandwidth than a compact ceramic patch antenna operating at the GPS frequencies. As shown in FIG. 8, the dash line represents the response of a helical GPS antenna according to the present invention, while the solid line represents the response of a typical ceramic patch antenna. The helix GPS antenna has a bandwidth of approximately 80 MHz, as shown at the −6 dB points on the plot.

Figure 9A:
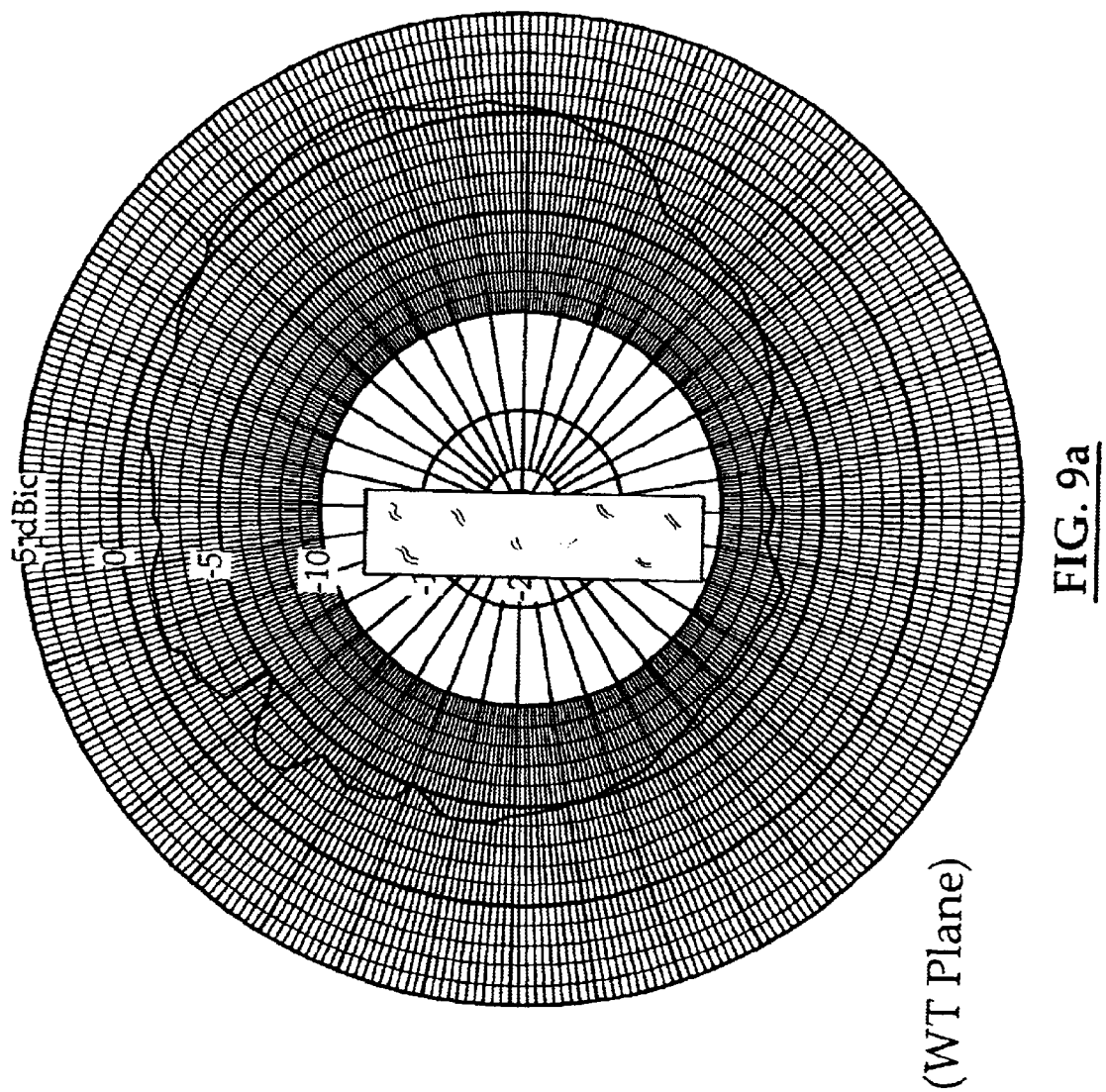
FIGS. 9a–9c are plots showing the radiation pattern of a mobile phone having a helix antenna in different planes.
Figure 9B:
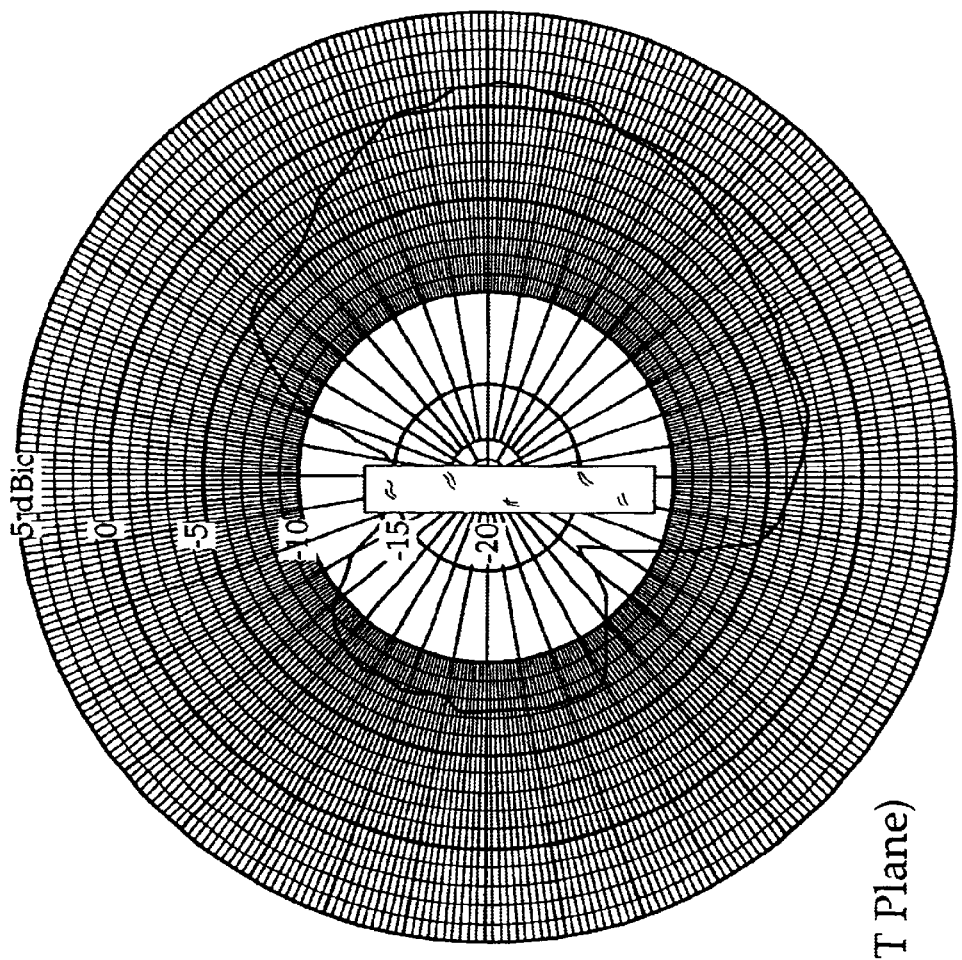
Figure 9C:
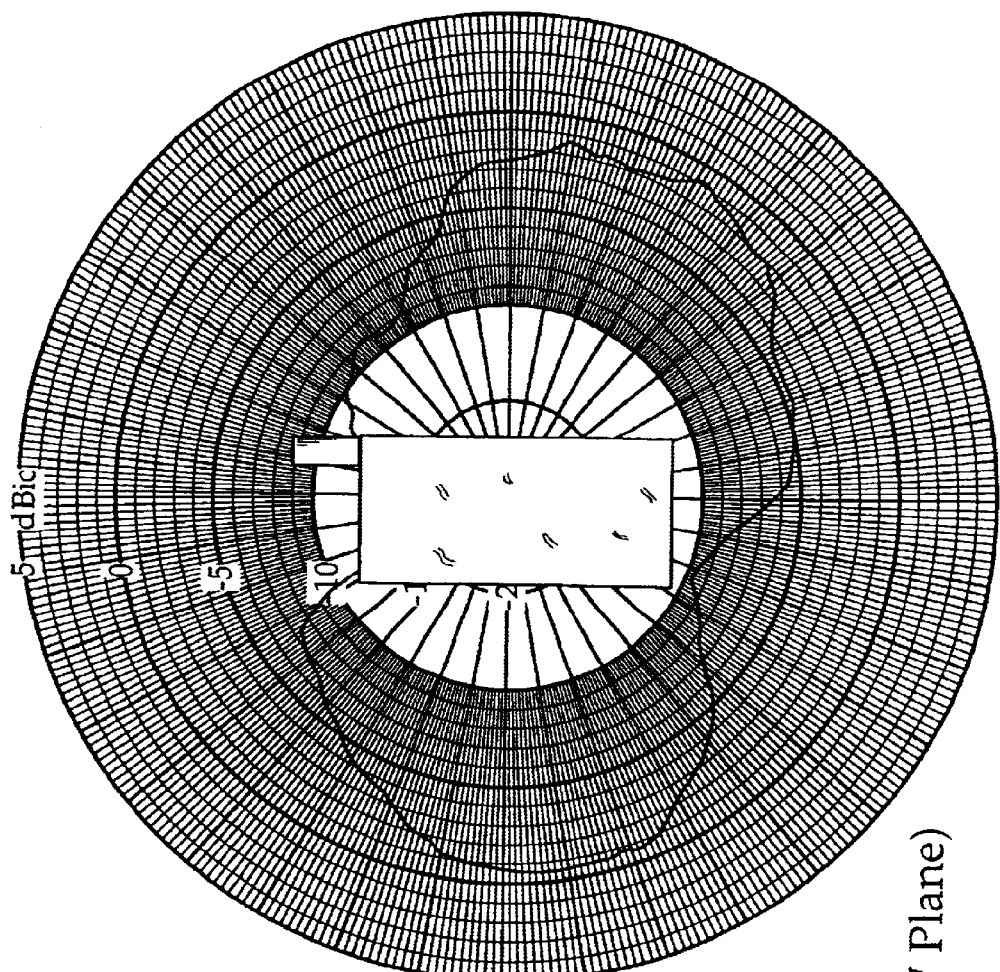

FIGS. 9a–9c are plots showing the right-handed circular or elliptical polarization radiation patterns of the helix antenna in different planes of the phone body. When the GPS antenna 10 is implemented on the PCB 106 as shown in FIG. 4a or FIG. 4b, the radiating pattern of a mobile phone having a helical GPS antenna at the GPS frequencies in a plane parallel to the WT plane of the antenna is shown in FIG. 9a. Similarly, the radiating pattern in a plane parallel to the HT plane of the antenna is shown in FIG. 9b while the radiation pattern in the HW plane is shown in FIG. 9c.

As mentioned earlier, when two GPS antennas are implemented on the same mobile phone, it is preferable to select the one antenna that yields the best response, which can then be selected for receiving the GPS signals. As shown in FIG. 10, a selection device 50, such as a pin diode or a micro electro-mechanical switch, under the control of a control device 60, is used to select one of the two antennas 10,10' for receiving the GPS signals 150. Pin diodes, micro electro-mechanical switches and control devices are known in the art.

Thus, the present invention has been disclosed according to the preferred embodiment of a normal mode monofilar helical antenna with dielectric loading and tapped feed. It will be understood that the shape of the radiating element and the shape of the supporting block can be changed without departing from the spirit and the scope of the present invention. For example, the radiating element can be shaped as a meander line as shown in FIG. 7 or a combination of a meander line and a helix. The λ/4 wire (the radiating element) can also be twisted in many different ways. Furthermore, the radiating element can be a (¾)λ or a (⅝)λ, and so forth. It should be noted that the major radiation in a mobile phone (or other hand-held device) is coming from the phone body. Depending on the location of the GPS antenna on the phone body, different radiating modes are generated to the phone body. Thus, the radiation properties of the antenna and the phone depend considerably on the location of the GPS antenna.

Furthermore, although the present invention has been described mostly in terms of the GPS frequency range, it will be understood that the antenna, according to the present invention, is applicable to all radio frequencies and it can also be used in a wireless device, such as a mobile phone, to receive messages or signals in the CDMA and WCDMA systems.

Thus, it will be understood that the foregoing is illustrative of the present invention and is not to be construed as limited to the specific embodiments disclosed. The scope of the invention is defined by the following claims, with equivalents of the claims to be included therein.

What is claimed is:

1. A method of achieving a right-handed circular or elliptical polarization field in a mobile terminal having a body radiation mode, said mobile terminal comprising a radio-frequency antenna, and a chassis or circuit board for mounting the radio-frequency antenna, the chassis or circuit board having four corners to define a plane having a first axis and a second axis perpendicular to the first axis, wherein the radio-frequency antenna comprises:

a radiator part; and a support frame for effecting dielectric loading on the radiator part, wherein the radiator part comprises:

a resonating region for transmitting and receiving signals in a radio frequency range;

a feeding region coupled to the resonating region for impedance matching, and an electrically grounding end located in the proximity of the feeding region, and wherein the radiator part has a first radiation mode and a second different radiation mode, said method characterized by disposing the radio-frequency antenna at one of the corners of the chassis or circuit board such that the first radiation mode propagates along the first axis and the second radiation mode propagates along the second axis, the first and second radiation modes forming an antenna radiation mode orthogonal to the body radiation mode the method being further characterized by providing a slit formed between corners of the chassis or circuit board, to tune the body radiation mode, for optimizing the right-hand circular or elliptical polarization field.

2. The method of claim 1, characterized in that the antenna radiation mode has a substantially 90-degree phase-shift relative to the body radiation mode.

3. The method of claim 1, wherein the support frame has a longitudinal axis and the radiating region has a spiral shape spiraling around the support frame along the longitudinal axis, said method further characterized in that the radio-frequency antenna is disposed such that the longitudinal axis of the support frame is substantially parallel to either the first axis or the second axis of the chassis or circuit board.

4. The method of claim 1, wherein the mobile terminal has a top side and a bottom side and the chassis or circuit board has two top corners adjacent the top side of the mobile terminal, said method characterized in that the radio-frequency antenna is disposed at one of the top corners.

5. The method of claim 4, further characterized by disposing a further radio-frequency antenna at the other one of the top corners, the further radio frequency antenna operating in the radio frequency range having a further radiation mode; and disposing means, operatively connected to the radio-frequency antenna and the further radio-frequency antenna, for selecting either the radio-frequency antenna or the further radio-frequency antenna, depending on the interaction between the body radiation mode and the antenna radiation mode and the interaction between the body radiation mode and the further radiating mode, in order to optimize the right-hand circular or elliptical polarization field.

6. The method of claim 5, characterized in that the selecting means comprises a pin diode.

7. The method of claim 5, characterized in that the selecting means comprises a micro-electromechanical systems switch.

8. A mobile terminal having a right-handed circular or elliptical polarization field with a body radiation mode, said mobile terminal comprising a radio-frequency antenna, and a chassis or circuit board for mounting the radio-frequency antenna, the chassis or circuit board having four corners to define a plane having a first axis and a second axis perpendicular to the first axis, wherein the radio-frequency antenna comprises:

a radiator part; and a support frame for effecting dielectric loading on the radiator part, wherein the radiator part comprises:

a resonating region for transmitting and receiving signals in a radio frequency range;

a feeding region coupled to the resonating region for impedance matching, and an electrically grounding end located in the proximity of the feeding region, and wherein the radiator part has a first radiation mode and a second different radiation mode, said mobile terminal characterized by the radio-frequency antenna being disposed at one of the corners of the chassis or circuit board such that the first radiation mode propagates along the first axis and the second radiation mode propagates along the second axis, the first and second radiation modes forming an antenna radiation mode orthogonal to the body radiation mode, the mobile terminal being further characterized in that the circuit board comprises a slit formed between corners of the chassis or circuit board, for tuning the body radiation mode and for optimizing the right-hand circular or elliptical polarization field.

* * * * *